United States Patent
Sano

(10) Patent No.: US 6,613,603 B1
(45) Date of Patent: *Sep. 2, 2003

(54) PHOTOVOLTAIC DEVICE, PROCESS FOR PRODUCTION THEREOF, AND ZINC OXIDE THIN FILM

(75) Inventor: Masafumi Sano, Kyoto (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/119,405

(22) Filed: Jul. 21, 1998

(30) Foreign Application Priority Data

Jul. 25, 1997 (JP) .............................................. 9-200122

(51) Int. Cl.[7] ................. H01L 31/0216; H01L 31/0392; H01L 21/00; H01L 21/44; B05D 1/36

(52) U.S. Cl. ......................... 438/72; 136/252; 136/258; 136/263; 438/609; 427/204; 427/205; 205/183; 205/184; 205/186; 205/220

(58) Field of Search ................................ 136/263, 258, 136/248, 252, 261, 265, 256; 438/69, 72, 95, 98, 608, 609, 678; 427/204, 205; 205/124, 155, 316, 333, 152, 153, 320, 323, 183, 184, 186, 220; 204/192.26, 192.27

(56) References Cited

U.S. PATENT DOCUMENTS

| | | | | |
|---|---|---|---|---|
| 5,244,509 A | * | 9/1993 | Arao et al. .................. | 136/259 |
| 5,486,238 A | | 1/1996 | Nakagawa et al. ......... | 136/259 |
| 5,506,420 A | * | 4/1996 | Kossovsky et al. ........... | 257/40 |
| 5,585,646 A | * | 12/1996 | Kossovsky et al. ........... | 257/40 |
| 5,686,368 A | * | 11/1997 | Wong ......................... | 501/152 |
| 5,804,466 A | * | 9/1998 | Arao et al. .................... | 438/95 |
| 6,238,808 B1 | | 5/2001 | Arao et al. ................. | 428/629 |

FOREIGN PATENT DOCUMENTS

| | | |
|---|---|---|
| EP | 0 794 270 | 9/1997 |
| EP | 0 890 995 | 1/1999 |
| JP | 60-084888 | 5/1985 |
| JP | 2-254199 | 10/1990 |
| JP | 05-121331 | 5/1993 |
| JP | 06-181325 | 6/1994 |

OTHER PUBLICATIONS

Saito, et al.; "High efficiency . . . rate", J. Non–Cry. Solids, 164–166 (1993) 689–692.
Izaki, et al.; "Electrolyte . . . Films", J. Electrochem. Soc., 143, 3, (1996) L53–L33.
Sannomiya, et al.; "α–Sic . . . Profiling", Tech. Dig. Int. PVSEC–5, Kyoto, 1990, 387–390.
Deckman, et al.; "Optical . . . Cells"; 16th IEEE Photovolt. Spec. Conf. 1982 San Diego, 1425–1426.
Tiedje, et al.; "Enhanced . . . Films", 16th IEEE Photovolt. Spec. Conf. 1982, San Diego, 1423–1424.

(List continued on next page.)

Primary Examiner—Harold Pyon
Assistant Examiner—Michael C. Miggins
(74) Attorney, Agent, or Firm—Fitzpatrick, Cella, Harper & Scinto

(57) ABSTRACT

A photovoltaic device is provided which comprises a back reflection layer, a zinc oxide layer and a semiconductor layer stacked in this order on a substrate, wherein the zinc oxide layer contains a carbohydrate. The content of the carbohydrate is preferably in the range of from 1 $\mu g/cm^3$ to 100 $mg/cm^3$. Thereby, the zinc oxide layer can be formed without abnormal growth to have a rough surface to achieve sufficient optical confinement effect, and the photovoltaic device is improved in the durability and the photoelectric conversion efficiency.

8 Claims, 8 Drawing Sheets

OTHER PUBLICATIONS

Inoue, et al.; "Optical . . . substrate", Prepoint; 51st Appl. Phys. Soc. Meeting, p. 747 (1990 Autumn) San Diego, 29 p–MF–2.

K. Nomoto, et al., "a–Si Alloy Three–Stacked Solar Cells with High Stabilized–Efficiency", Tech. Dig. Int. PVSEC–7, Nagoya, Japan, pp. 275–276 (1993).

S. Guha, et al., "Progress in Multijunction Amorphous Silicon Alloy–Based Solar Cells and Modules", Tech. Dig. Intl. PVSEC–7, Nagoya, Japan, pp. 43–46 (1993).

S. Peulon, et al., "Cathodic Electrodeposition from Aqueous Solution of Dense or Open–Structured Zinc Oxide Films", Advanced Materials, vol. 8, No. 2, pp. 168–170 (1996).

Patent Abstracts of Japan, vol. 1998, No. 10, Aug. 31, 1998 (corresponds to JP 10–140373).

Patent Abstracts of Japan, vol. 1996, No. 12, Dec. 26, 1996 (corresponds to JP 08–217443).

* cited by examiner

PHOTOVOLTAIC DEVICE, PROCESS FOR PRODUCTION THEREOF, AND ZINC OXIDE THIN FILM

BACKGROUND OF THE INVENTION

1. Field of the Invention

The present invention relates to a photovoltaic device composed of a non-single-crystalline semiconductor material of a silicon type, and a process for producing the photovoltaic device. In particular, the present invention relates to an inexpensive solar cell exhibiting a high photoelectric conversion efficiency and a process for producing it. The present invention relates also to a zinc oxide thin film, and a process for producing it.

2. Related Background Art

In recent years, the demand for solar cells is growing as power generation equipment. In particular, photoelectric power generation is attracting attention which is conducted by solar cell modules of about 3 kW mounted on a roof of a private house and which is connected to a commercial power supplying system, whereby electric power is soled to or brought from the commercial system. A governmental subsidy system has already been enforced. Under such circumstances, the photoelectric power generation has disadvantages that the power generation cost is too high to compete the commercial power generation, and that the generation capacity is low to meet the power demand. To offset the above disadvantages, the solar cell is required to have a high photoelectric conversion efficiency, stable power generation ability for a long term of about 20 years or more, a high power generation capacity, and a low cost/power performance. At present, the material for the solar cell includes crystalline silicon (c-Si), polycrystalline silicon (poly-Si), amorphous silicon (a-Si), GaAs, and CdS. Of these, the amorphous silicon solar cell is advantageous in production performance and the cost/power performance. After the Kobe-Osaka-Awaji Great Earthquake Disaster, weight reduction of the roof material comes to be demanded. In this respect, light-weight amorphous silicon solar cell is advantageous. Further, the amorphous silicon solar cell is advantageous in installation on a curved surface. However, the amorphous solar cell does not achieve the high photoelectric conversion efficiency of the crystalline silicon solar cell at the moment, and is naturally deteriorated in photoelectric conversion efficiency by exposure to intense light.

Therefore, improvements of non-single-crystalline silicon type solar cells are widely investigated as below. For example, for amorphous silicon type materials, trials are being made for improving light collection efficiency by narrowing the bandgap by addition of Ge or Sn to the i-type layer in an amount ranging from 1% to 50%, or for raising the open circuit voltage by broadening the bandgap by addition of C, N, O, or the like in an amount ranging from 0.1% to 10%. Other trials are being made for collecting broader range of light by stacking an element having a higher open circuit voltage at a light introducing side and an element having a lower open circuit voltage at a back side. With the stack type solar cell, the thickness of the i-type layer is tried to be made smaller to retard the photo-deterioration. For example, a photoelectric conversion efficiency of 9.5% after photo-deterioration was achieved with a solar cell having constitution of a-Si/a-SiGe/a-SGe, or a-Si/a-Si/a-SiGe by S. Guha, J. Yang: Technical Digest of 7th International Photovoltaic Science and Engineering Conference Nov. 1993, NAGOYA JAPAN, p43 "Progress in Multijunction Amorphous Silicon Alloy-Based Solar Cells and Modules". A photoelectric conversion efficiency 10.2% after photo-deterioration of was achieved with a solar cell having constitution of a-SiC/a-SiGe/a-SiGe by K. Nomoto, Y. Yamamoto: Technical Digest of 7th International Photovoltaic Science and Engineering Conference Nov. 1993, NAGOYA JAPAN, p43 "Progress in Multijunction Amorphous Silicon Alloy-Based Solar Cells and Modules". "a-Si Alloy Three-Stacked Solar Cells with High Stabilized-Efficiency".

An attempt was made to lower the power cost by forming an a-Si layer and a-SiGe layer by microwave plasma CVD at a higher deposition rate by K. Saito, I. Kajita: Journal of Non-Crystalline Solids 146–166 (1993) p689–692 "High efficiency a-Si:H alloy cell deposited at high deposition rate". According to this report, a photoelectric conversion efficiency of 11.6% was achieved with a constitution of a-Si/a-SiGe/a-SiGe by use of a-Si formed at a deposition rate of 75 A/sec and a-SiGe formed at a deposition rate of 100 A/sec.

A plasma CVD apparatus is disclosed which forms continuously semiconductor layers of different conduction types by a roll-to-roll system in Japanese Patent Application Laid-Open No. 05-121331. This apparatus has a plurality of deposition chambers, and a belt-like flexible substrate is arranged along the path so as to pass through the deposition chambers successively. The substrate is delivered in its length direction while a semiconductor layer of a desired conduction type is formed in each of the respective deposition chambers, thereby continuously producing a photovoltaic device having a p-i-n junction. The above disclosed apparatus employs a gas gate which prevents diffusion of the source gas for introducing valence electron controlling agent into the semiconductor layer to another deposition chamber and thereby prevents contamination of another semiconductor layer. Specifically, the deposition chambers are separated by a slit-shaped separation path where a sweeping gas such as Ar, $H_2$ and He is introduced to prevent mutual diffusion of the source gases, whereby a desired p-i-n junction is formed. This roll-to-roll system for thin film formation improves remarkably the productivity of photovoltaic devices having a stacked structure.

A transparent electroconductive layer having a surface of a projection-recess structure (texture structure) is known to improve light collection efficiency. For example, Preprint of 51th Applied Physics Society Meeting p747 (1990 Autumn) 29p-MF-2 "Optical Confinement Effect in a-SiGe Solar Cell on Stainless Steel Substrate"; and Sannomiya et al., Technical Digest of the International PVSEC-5, Kyoto, Japan, p387, 1987 disclose improvement of short-circuiting photoelectric current by forming a back reflection layer composed of Ag and a transparent layer composed of zinc oxide in a suitable surface texture structure. T. Tiedje, et al.: Proc. 16th IEEE Photovoltaic Specialist Conf. (1982) p1423, and H. Deckman, et al.: Proc. 16th IEEE Photovoltaic Specialist Conf. (1982) p1425 disclose improvement of photoelectric conversion efficiency by forming a back electrode into a projection-recess shape (texture structure) having a size approximate to light wavelength for scattering light to scatter long wavelength light which has not been absorbed in the semiconductor layer and lengthen the optical path in the semiconductor layer, thereby raising sensitivity of the photovoltaic device to respect with the long wavelength light to increase short-circuit photoelectric current.

Zinc oxide is more resistant to plasma than tin oxide and indium oxide, and when zinc oxide is exposed to plasma containing hydrogen, it is not reduced by hydrogen. When a semiconductor layer composed of amorphous silicon is formed on zinc oxide by plasma CVD, zinc oxide is positively used as a transparent electroconductive layer.

Japanese Patent Application Laid-Open No. 60-84888 (Energy Conversion Devices) discloses a technique for decrease of electric current passing through defective regions in a semiconductor layer by interposition of a transparent electroconductive layer between a back electrode and a semiconductor layer.

Japanese Patent Application Laid-Open No. 7-23775, and Masanobu Izaki, Takasi Omi: Journal of Electrochemical Soc. Vol.143, No.3 "Electrolyte Optimization for Cathodic Growth of Zinc Oxide Films" discloses electrochemical deposition of a transparent zinc oxide thin film by applying electric current between counter electrodes immersed in an aqueous zinc nitrate solution. This method requires neither an expensive vacuum apparatus nor an expensive target, thereby remarkably reducing the production cost of the zinc oxide. This method can be employed for deposition on a substrate of a large area and therefore is promising for a large-area photovoltaic device like solar cells.

As understood from the aforementioned disclosures, zinc oxide is desirable for use as the transparent electroconductive layer having a texture structure on the surface. The known process for producing zinc oxide thin film includes vacuum deposition, sputtering, ion-plating, and CVD. These methods employs an expensive vacuum apparatus, and the vapor deposition source is expensive, and does not exhibit sufficient optical confinement effect in the optical wavelength range from 600 nm to 1000 nm. Other methods include wet processes such as a spray-pyrolysis method, and a sol-gel method. In the wet processes, the substrate is required to be heated to a temperature ranging from 300° C. to 800° C., so that the useful substrates are limited. In spite of such many investigations, known photovoltaic devices do not satisfy all of the properties of high photoconductivity, high durability, high production yield, and low cost.

SUMMARY OF THE INVENTION

An object of the present invention is to provide a photovoltaic device which has solved the above problems.

Specifically, another object of the present invention is to provide a photovoltaic device by forming a transparent electroconductive layer composed of zinc oxide on an electroconductive substrate with sufficient adhesion without abnormal growth portion with suitable roughness of the surface to give sufficient optical confinement of the photovoltaic device.

Still another object of the present invention is to provide a flexible solar cell of light weight capable of generating electric power for a long term at a low power-generation cost.

A further object of the present invention is to provide a method of photovoltaic power generation by using a solar cell module constituted of the photovoltaic devices which is mounted on a roof of a private house.

A still further object of the present invention is to provide night illumination apparatuses in parks and roads, guide lamps, and indoor ventilation apparatuses, separated from commercial power lines.

In order to solve the above problems, the present invention provides a photovoltaic device comprising a back reflection layer, a zinc oxide layer, and a semiconductor layer stacked in this order on a substrate, wherein the zinc oxide layer contains a carbohydrate.

The content of the carbohydrate in the zinc oxide layer ranges preferably from 1 $\mu g/cm^3$ to 100 $mg/cm^3$. The carbohydrate incorporated into the zinc oxide layer in the photovoltaic device of the present invention remarkably improves adhesion of the zinc oxide layer to an adjacent back reflection layer or an adjacent subbing layer such as an intermediate layer in comparison with conventional photovoltaic devices. Further the carbohydrate incorporated into the zinc oxide suitably controls the growth of the zinc oxide crystals to give a suitable surface roughness, thereby causing optical confinement or light scattering in the wavelength range from 600 to 1000 nm to obtain the excellent properties of the photovoltaic device of the present invention.

The aforementioned back reflection layer may be formed from gold, silver, aluminum, or copper. When aluminum is employed for the back reflection layer, a transparent and electroconductive intermediate layer is preferably provided on the aluminum layer by sputtering or a like method.

The present invention provides a zinc oxide thin film containing a carbohydrate at a content ranging from 1 $\mu g/cm^3$ to 100 $mg/cm^3$.

The present invention further provides a process for electrochemically forming a zinc oxide layer by applying electric current between an electroconductive substrate and a counter electrode immersed in an aqueous solution containing at least zinc ions and a carbohydrate. The present invention further provides a process for producing a photovoltaic device employing the above process for forming the zinc oxide layer. The cost of production by the electrochemical method of the present invention is about 1/100 times that of a sputtering method.

The potential difference between the electroconductive substrate and the counter electrode is controlled preferably in the range from 0.1 V to 30 V. Under this condition, the carbohydrate can be suitably and stably incorporated in the zinc oxide layer to significantly retard abnormal crystal growth and thereby improve the yield.

The aforementioned aqueous solution contains preferably at least zinc ions, a carbohydrate and nitrate ions; it contains at least zinc ions, a carbohydrate, ammonium ions and complex ions such as zinc ammonia complex ion (including ammine complex ions); or it contains at least zinc ions, a carbohydrate, and hydrogenzincate ions or zincate ions.

BRIEF DESCRIPTION OF THE DRAWINGS

FIG. 4A is a schematic exploded view thereof. FIG. 4B is a schematic plan view thereof taken from the light incident side.

DESCRIPTION OF THE PREFERRED EMBODIMENTS

The zinc oxide thin layer, the process for forming the zinc oxide thin layer, the photovoltaic device employing the zinc oxide thin film, and the process for producing the photovoltaic device are described below in detail by reference to drawings.

Figure 1A:
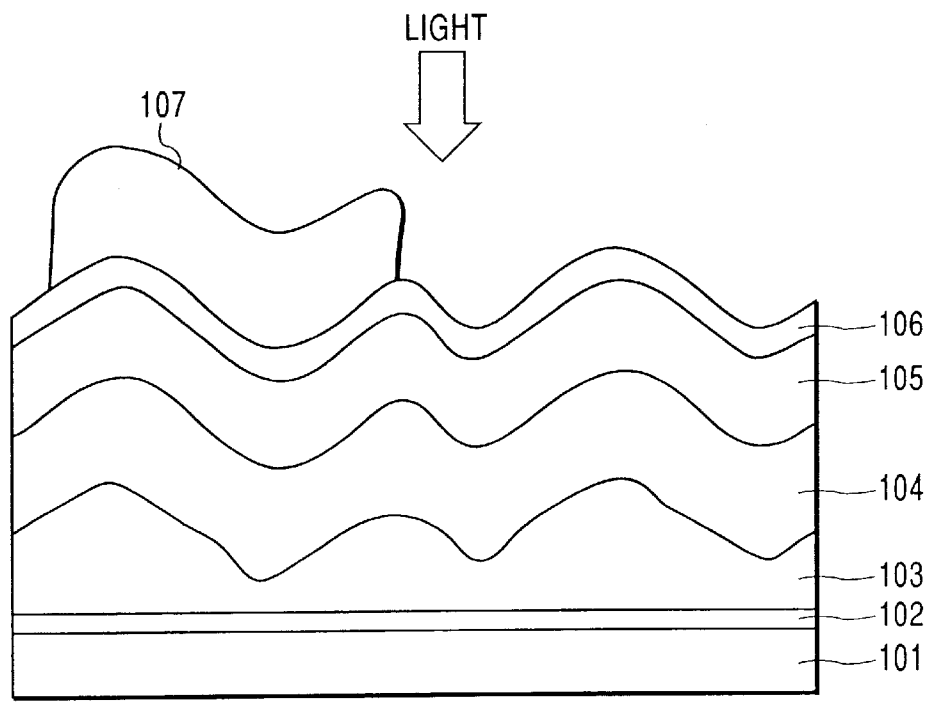
FIG. 1A is a schematic sectional view showing an example of the photovoltaic device of the present invention.
Figure 1B:
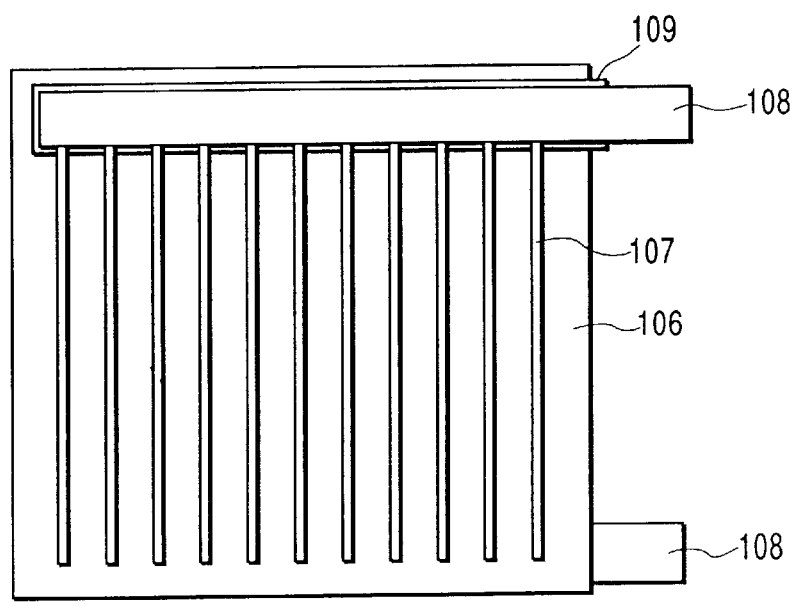
FIG. 1B is a schematic plan view of the photovoltaic device taken from a light incident side.

FIG. 1A is a schematic sectional view of an example of the photovoltaic device of the present invention. In FIG. 1A, an electroconductive substrate 101 made from stainless steel or the like supports the device. A back reflection layer 102 is mainly composed of gold, silver, copper, or aluminum. A transparent electroconductive layer 104 is a zinc oxide layer of the present invention containing a carbohydrate, having functions of returning light unabsorbed in a semiconductor layer 105 to the semiconductor layer, diffusing light to lengthen optical path inside the semiconductor layer, confining the light therein, and preventing short-circuiting. The semiconductor layer 105 is constituted of non-single-crystalline silicon material, having at least one p-i-n junction, and having photoelectric conversion function. An upper transparent electrode layer 106 effectively introduces light into the semiconductor layer and supplies the generated photoelectric current to a collecting electrode. The collecting electrodes 107 collect photoelectric current and are arranged in a shape of a comb viewed from incident light direction for effectively introducing light into the semiconductor layer. FIG. 1B is a schematic plan view of the photovoltaic device shown in FIG. 1A, taken from a light incident side. A plurality of collecting electrodes are arranged without crossing on the surface of the device, and ends of the collecting electrodes are electrically connected to a busbar 108. The busbar 108 is formed from a good electroconductive metal material such as copper plate on the collecting electrodes 107. The busbar is made to adhere to the upper transparent electrode with interposition of an insulating double-coated tape.

Figure 2:
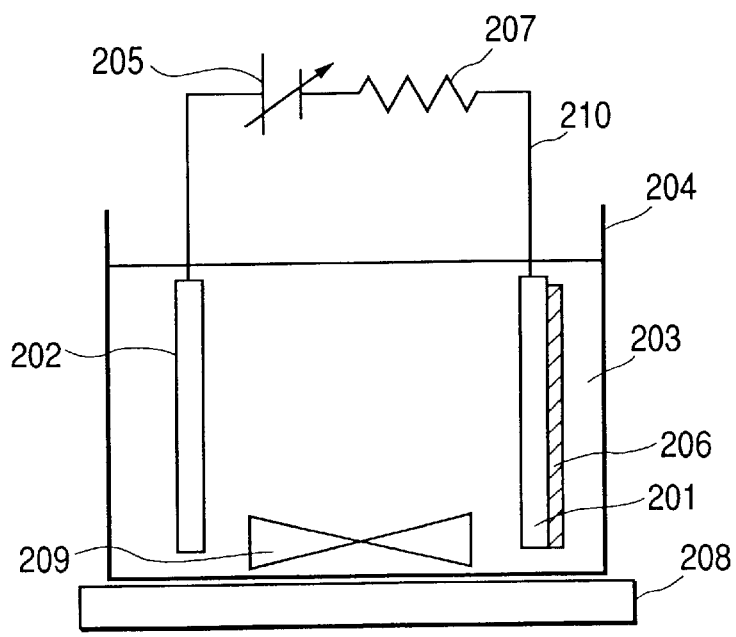
FIG. 2 is a schematic sectional view of an apparatus for forming a zinc oxide layer (thin film).

FIG. 2 is a schematic sectional view showing an apparatus for forming a zinc oxide layer of the present invention containing a carbohydrate. In FIG. 2, the numeral 201 indicates an electroconductive substrate. A counter electrode 202 has electroconductivity, and is made from carbon, platinum, platinum-plated titanium, or zinc. An aqueous electrolytic solution 203 for formation of the zinc oxide layer contains carbohydrate of the present invention. The aqueous electrolytic solution contains at least zinc ions, a carbohydrate, and nitrate ions; it contains at least zinc ions, a carbohydrate, ammonium ions and complex ions such as zinc ammonia complex ion (including ammine complex ions); or it contains at least zinc ions, a carbohydrate, and hydrogenzincate ions or zincate ions. Specific examples of the solution includes an aqueous solution of zinc nitrate and saccharose; an aqueous ammoniacal solution of zinc oxide and dextrin; an aqueous ammoniacal solution of zinc acetate and glucose; aqueous ammoniacal solution of zinc oxalate and dextrin; and aqueous ammoniacal solution of zinc oxide, acetic acid, and dextrin. A vessel 204 is made from an acid-resistant and alkali-resistant material, like a plastic beaker. A DC power source 205 is preferably capable of setting a potential relative to a standard electrode. Industrially, however, any usual DC power source is useful, and is connected suitable in consideration of electric polarity. An insulating tape 206 prevents, on the both surfaces of the electroconductive substrate, formation of light-transmissive electroconductive layer composed of carbohydrate-containing zinc oxide of the present invention. When the transparent electroconductive layer is to be formed on both of the surfaces, the insulating tape is not used. A circuit 210 has a load resistance 207. The apparatus has a heater 208 for heating the aqueous solution, and a magnetic stirrer 209. The operation of this apparatus is described below specifically. In the vessel 204 is prepared the aqueous solution 203 containing the aforementioned ions and carbohydrate of the present invention: for example, an aqueous ammonia solution of zinc oxide, acetic acid, and dextrin. The aqueous solution 203 is stirred well with the magnetic stirrer 209, and is heated to a predetermined temperature with the heater 208. Then the counter electrode 202, and the electroconductive substrate 201 having the insulating tape 206 adhering thereto are connected to the power source 205 to form a circuit 210 including the aqueous solution 203, and to apply a voltage to the circuit 210 at a constant current mode. Thereby, a transparent zinc oxide layer containing a carbohydrate of the present invention deposites on the surface of the electroconductive substrate of the negative electrode. When a predetermined thickness of a transparent electroconductive layer (zinc oxide layer) has been formed, the voltage application is stopped. Immediately, the electroconductive substrate having the transparent electroconductive layer formed thereon is taken out, and is washed with pure water. In the case where the aforementioned aqueous ammoniacal solution of zinc oxide and acetic acid; an aqueous ammoniacal solution of zinc acetate; an ammoniacal solution of zinc oxalate; an ammoniacal solution of zinc hydroxide and acetic acid; or the like is employed as the supplying source of zinc ions, excess ammonium ions and complex ions such as hydrogenzincate ions and zincate ions, the zinc concentration in the aqueous solution is preferably in the range of from 0.001 mol/liter to 3.0 mol/liter. The carbohydrate contained in the zinc oxide layer may be any of monosaccharides, disaccharides, and polysaccharides, and preferably has a concentration ranging from 1 $\mu g/cm^3$ to 100 $mg/cm^3$. Presumably, a small amount of the carbohydrate serves as a thermosetting crosslinking agent in the zinc oxide layer to stabilize it even in plasma during semiconductor layer formation. The hydrogen ion index (pH) of the aqueous solution is preferably controlled within the range from pH 4.5 to pH 12. The temperature of the solution is preferably not lower than 50° C. The current density at the surface of the electroconductive substrate is preferably in the range from 0.1 $mA/cm^2$ to 100 $mA/cm^2$. The potential difference between the electroconductive substrate and the counter electrode is in the range from 0.1 V to 30 V. Presumably, a small amount of carbohydrate is stably and uniformly incorporated in the zinc oxide layer by controlling the growth of the zinc oxide. The above layer formation conditions depend on the kind, the cross-sectional shape, and the crystalline state of the back reflection layer, and cannot be definitely decided. Generally, the crystal grains of zinc oxide tends to be larger and the layer surface tends to be rougher at a higher concentration of the complex such as hydrogenzincate ions and zincate ions, and at a higher concentration of zinc nitrate ions. The crystal grains of zinc oxide tends to be larger at a lower temperature of film formation. Further, the surface roughness tends to be less at a higher current density. However, since the layer formation rate is approximately proportional to the current density, the surface is formed rough preferably with a higher current density in order to reduce the cost of the transparent electroconductive layer composed of zinc oxide.

In the layer formation of the present invention, a small amount of a carbohydrate such as saccharose and dextrin is added into the aqueous solution so that the formed zinc oxide layer may contain the carbohydrate at a content ranging from 1 $\mu g/cm^3$ to 100 $mg/cm^3$. Generally, in formation of zinc oxide thin film, abnormal growth can occur remarkably in a rising plate-like shape of 10 $\mu m$ or more at a current density of 5 $mA/cm^2$ or more, although a higher current density is advantageous industrially. Such abnormal growth in a rising plate-like shape makes thinner the semiconductor layer locally at the site of the abnormal growth to cause excessive current leakage, making the device useless. However, incorporation of saccharose or dextrin into the zinc oxide thin film of the present invention almost completely prevents the abnormal growth, and remarkably improves adhesion to the underlying substrate and thermal stability of the layer. Presumably, the saccharose or dextrin which is high-molecular, dissolves out into the aqueous solution to suitably retard the growth of the zinc oxide, and is suitably incorporated into the zinc oxide layer. This formation process improves the photovoltaic properties, the yield, and the durability of the photovoltaic device. A carbohydrate other than saccharose and dextrin may be used, or saccharose and dextrin may be used in combination. The carbohydrate content in the zinc oxide layer is not effective in an amount of less than 1 $\mu g/cm^3$. On the other hand, the carbohydrate content more than 100 $mg/cm^3$ makes the surface of the zinc oxide film flat and is not suitable for roughening of the surface, lowers the light transmittance at 800 nm, and impairs thermal stability to cause coloring to black brown by heating.

When aluminum is used as the material for the back reflection layer, since aluminum has high reflectivity to the light of wavelength of 600 nm to 1000 nm and does not cause electrochemical migration, aluminum is most suitable for the back reflection layer of a photovoltaic device. However, it is difficult to electrochemically grow the zinc oxide directly on aluminum in the aforementioned aqueous solution (electroplating). Therefore, in the present invention, an extremely thin transparent electroconductive layer is formed as an intermediate layer on aluminum. This intermediate layer should be transparent to the light of wavelength of from 600 nm to 1000 nm, and be electroconductive to a certain extent. The material for the intermediate layer includes tin oxide ($SnO_2$), indium oxide ($In_2O_3$), ITO ($SnO_2+In_2O_3$), zinc oxide (ZnO), indium zinc oxide, and tin zinc oxide. Such an oxide can be formed by sputtering, CVD, or vacuum vapor deposition. On such an intermediate layer, the transparent electroconductive layer of zinc oxide can be formed according to the method of the present invention. The zinc oxide layer formed on the intermediate layer is capable of optically confining or scattering the light of wavelength ranging from 600 nm to 1000 nm. Thus the photovoltaic device of the present invention has a high quality and is capable of generating electric power at a low cost.

Figure 3:
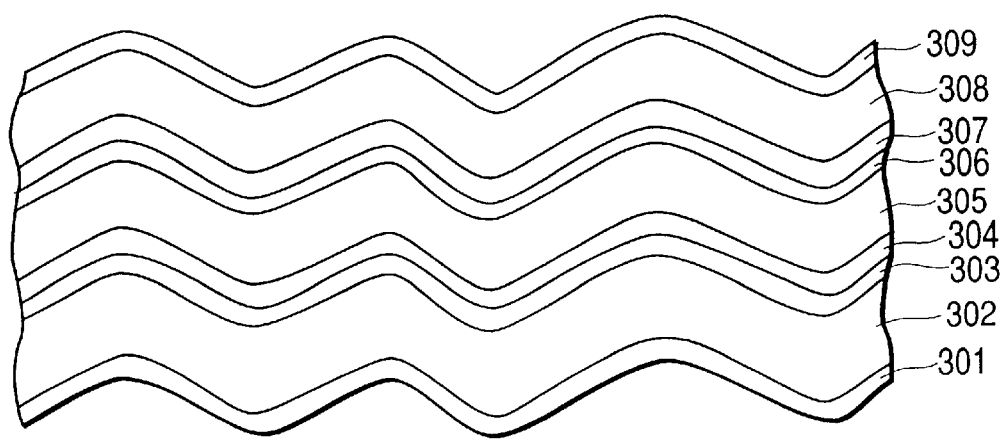
FIG. 3 is a schematic sectional view of an example of layer constitution of a semiconductor layer of photovoltaic device of the present invention.

FIG. 3 is a schematic sectional view showing an example of layer constitution of a semiconductor layer 105 composed of a hydrogen-containing non-single-crystalline silicon type material and having at least one p-i-n junction in the interior. The semiconductor layer shown in FIG. 3 has three p-i-n junctions. In FIG. 3, the first doped layer 301 is formed on a first transparent electroconductive layer and has p-type or n-type conductivity. The semiconductor layer is constituted of layers of hydrogen-containing non-single-crystalline silicon material successively stacked as shown in the drawing. In this example, the first doped layer 301, the third doped layer 304, and the fifth doped layer 307 have the same type of conductivity, and second doped layer 303, the fourth doped layer 306, and the sixth doped layer 309 have another type of conductivity different from the former layers. The first i-type layer 302, the second i-type layer 305, and the third i-type layer 308 have intrinsic conductivity. Higher efficiency of light collection preferably requires the relationship of the bandgap of the first i-type layer<the bandgap of the second i-type layer<the bandgap of the third i-type layer.

Figure 4A:
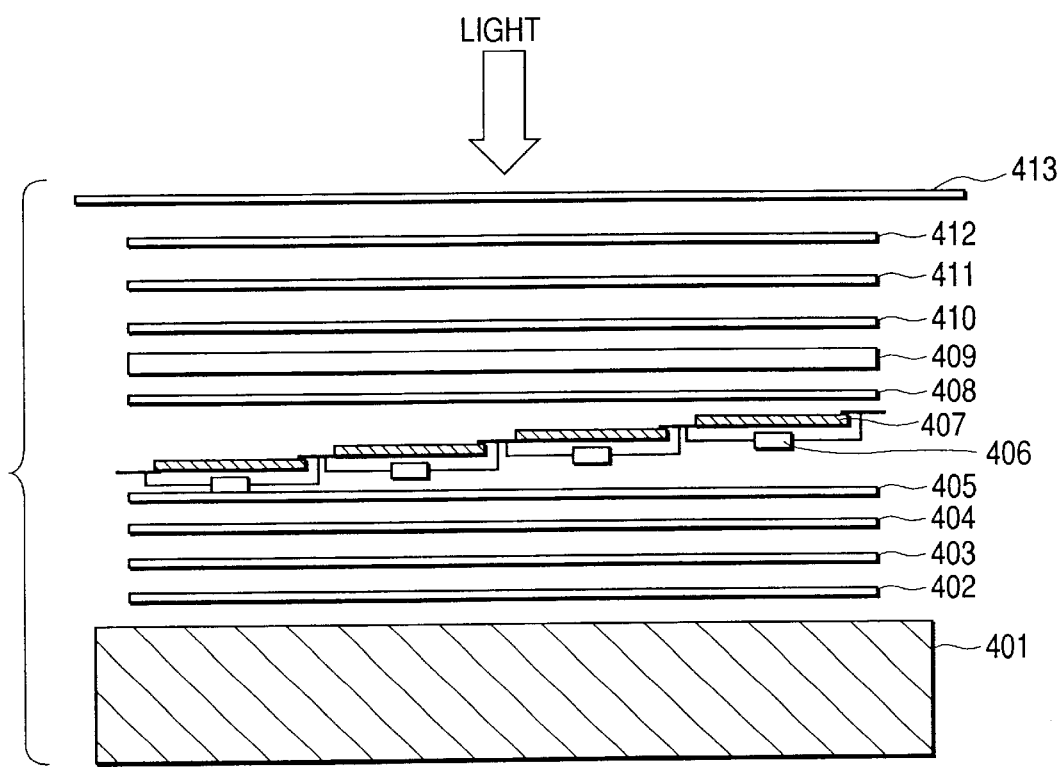
FIGS. 4A and 4B illustrates a photovoltaic device module of the present invention.
Figure 4B:
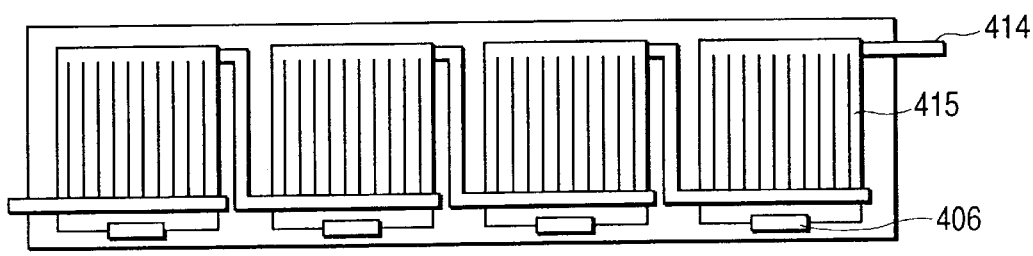

FIGS. 4A and 4B illustrate one embodiment of the photovoltaic device module of the present invention. FIG. 4A is a schematic exploded view thereof. FIG. 4B is a schematic plan view thereof. In FIGS. 4A and 4B, a plurality of photovoltaic devices are arranged in series, and by-pass diodes 406 are connected in parallel to the respective photovoltaic devices. Thereby, even when one photovoltaic device is shadowed, all the voltages generated by the other photovoltaic devices are not applied to the shadowed device. The photovoltaic module of the present invention is formed by arranging layers in the order as shown in FIG. 4A (EVA layers 402, 404, 409, 411; nylon resin layer 403, photovoltaic device 407; glass nonwoven fabric sheets 405, 408, 410, 412), and then sealing with a fluororesin 413 and the supporting substrate 401 to prevent penetration of humidity. In this example, the collecting electrode 415 for the photovoltaic module is prepared by forming, on a thin copper wire, a silver cladding layer, and a carbon layer having an acrylic resin as a binder and fusion-bonding it on the upper transparent electrode layer. The silver cladding layer reduces the contact resistance with copper wire. The carbon layer having an acrylic resin as a binder is brought into close contact with the upper transparent electrode layer to reduce the contact resistance of the silver-cladding layer and to prevent diffusion of the silver from the silver cladding layer into the semiconductor layer.

Figure 5:
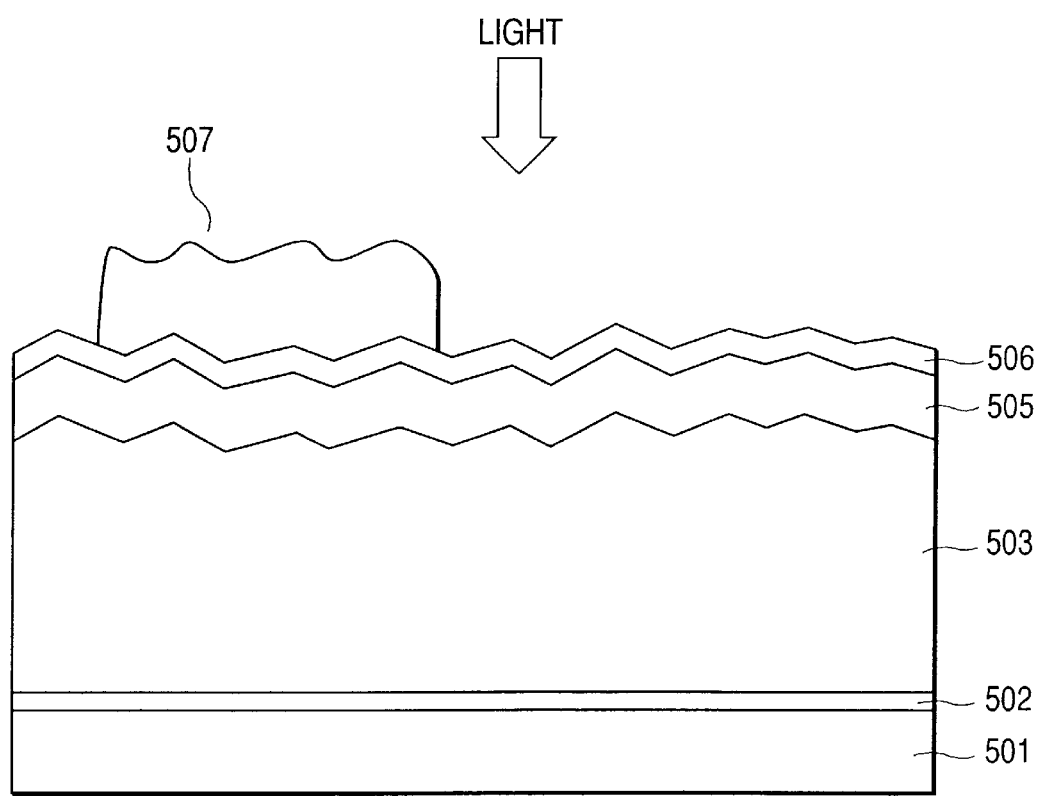
FIG. 5 is a schematic sectional view showing a photovoltaic device of the present invention having no intermediate layer.

FIG. 5 is a schematic sectional view of a photovoltaic device of the present invention having no intermediate layer. The device comprises an electroconductive substrate 501 similar to the substrate 101, a back reflection layer 502 similar to the layer 102, a zinc oxide layer (transparent electroconductive layer) 503, a semiconductor layer 505 similar to the layer 105, an upper transparent electrode layer 506 similar to the layer 106, and a collecting electrode 507 similar to the electrode 107.

The respective parts are described below in more detail.
(Electroconductive Substrate 101, 501)

The electroconductive substrate employed in the present invention may be a single body, or may have one or more thin films formed thereon. The substrate itself may be an insulating material, provided that one surface thereof is electroconductive. The material having electroconductivity includes metals such as Cu, Ni, Cr, Fe, Al, Cr, Mo, Nb, Ta, V, Ti, Rh and the like, and alloys thereof. Such a material itself may be used as the base material of the substrate. In particular, stainless steel, Fe, and the like are suitable in view of workability, strength, chemical stability, and cost. The insulating base material for the substrate includes synthetic resins such as polyester, polyethylene, polycarbonate, cellulose acetate, polypropylene, polyvinyl chloride, polyvinylidene chloride, polystyrene, and polyamide; glass; and ceramics. At least one surface of the insulating material is coated with a thin film composed of the aforementioned electroconductive material to form the electroconductive substrate. When the above materials are used as the substrate, they are preferably used in a sheet-like shape or a roll of a belt-like shape wound on a cylinder. The formation of the thin film on the base material for the substrate is conducted by vacuum deposition, sputtering, screen printing, dipping, plasma CVD, electroplating, electroless plating, or a like method. The surface smoothness of the substrate is preferably such that the center-line-average surface roughness Ra is not more than 3.0 $\mu$m. For surface roughening, the substrate surface may be etched suitably with a solution of an acid such as $HNO_3$, HF, HCl, and $H_2SO_4$. When the substrate is required to be flexible, the thickness of the substrate is made as thin as possible provided that the substrate can serve as the supporting member. Usually the thickness is preferably not less than 10 $\mu$m in view of production, handling, and mechanical strength of the supporting member. The surface of the substrate is preferably washed with a surface active agent or an organic substance for preventing exfoliation of the back reflection layer, or the transparent electroconductive layer.

(Back Reflection Layer 102, 502)

The back reflection layer used in the present invention may be constituted of a single layer or plural layers, and contains gold, silver, copper, aluminum, or the like. As mentioned before, the transparent electroconductive layer cannot readily be formed directly on aluminum, so that an intermediate layer having transparency and electoconductivity is formed on the aluminum layer. In any case, the total thickness is preferably in the range from 0.01 to 0.5 $\mu$m. The back reflection layer is preferably formed by vacuum vapor deposition, sputtering, or electrochemical deposition from an aqueous solution (electroplating). The back reflection layer may have a flat surface or a rough surface. In formation of the back reflection layer by sputtering, the substrate temperature is preferably set to 150° C. or more to roughen the surface for improved adhesion to the electroconductive substrate.

(Semiconductor Layer 105, 505)

This layer is important since it contributes directly to the photoelectric properties such as conversion efficiency, open circuit voltage, and short-circuit photoelectric current of the photovoltaic device. The semiconductor layer of the present invention has one or more p-i-n junctions, and is constituted of a non-single-crystalline silicon type material. The p-i-n junction is formed on a pn junction. The non-single-crystalline silicon type material has usually an amorphous structure (a-), a microcrystalline structure ($\mu$c-), or a poly-crystalline structure (poly-), specifically including a-Si, a-SiGe, a-SiSn, a-SiC, a-SiO, a-SiN, $\mu$c-Si, $\mu$c-SiC, and poly-Si. For obtaining a p-type material from the above materials, an element such as B and Al is added, whereas for obtaining an n-type material therefrom, an element such as P, As and Sb is added. For an amorphous or microcrystalline material, defects such as dangling bonds should be compensated by addition of an element like H, F or Cl. Thereby, the fill factor of the photovoltaic device is remarkably improved. The n-type layer, the i-type layer, and the p-type layer may be formed in this order from the substrate side, or reversely in the order of the p-type layer, the i-type layer, and the n-type layer. When a pn junction is employed, the order of the layer may be either n-p/n-i-p or p-n/p-i-n. Although the p-i-n junction may be of a single structure, two or more p-i-n junctions are preferably provided to retard photo-deterioration of the photovoltaic device: the photo-deterioration means the phenomena of drop of the fill factor and the open-circuit voltage caused by exposure to intense light to thereby result in lowering of the photoelectric conversion efficiency with lapse of time. FIG. 3 shows a device having three junctions: for example, a-SiGe:H as the first i-type layer, a-SiGe:H layer as the second i-type layer, and a-Si:H layer as the third i-type layer. The i-type layers may be of a single layer structure, or may be of a stacked structure like a-Si/a-Si, or a-Si/a-SiGe/a-Si. For making the i-type layer more intrinsic, B or the like may be added to the layer. In forming a pn junction, poly-Si or $\mu$c-Si is preferably employed to which the above element for the p-type or n-type is added. These material are preferred in outdoor use for long period since they do not undergo the aforementioned photo-deterioration. These materials, which has a lower absorption coefficient to visible light than an amorphous material, are formed into a film of thickness of not less than 0.5 $\mu$m.

The n-type layer and the p-type layer are formed preferably from a material having a light absorption coefficient as low as possible, the material including a-Si, a-SiC, a-SiO, a-SiN, $\mu$c-Si, $\mu$c-SiC, and poly-Si.

The p-i-n junction constituted of a non-single-crystalline silicon material like the above material of a-Si, a-SiC, a-SiO, a-SiN, $\mu$c-Si, $\mu$c-SiC, or poly-Si is formed usually by plasma CVD. In particular, for formation of the i-type layer, microwave plasma CVD is preferred which can conduct deposition at a large rate. The formation of poly-Si on a substrate may conducted by forming a-Si by plasma CVD, sputtering, or a like method on the substrate, and subsequently making it polycrystalline by laser irradiation, high frequency power application, or a like method. For formation of an amorphous silicon layer by RF plasma CVD, the source gas is diluted preferably with Ar, $H_2$, He, or the like by a factor of 1 to 100. For formation of a non-single-crystalline silicon layer having a microcrystalline structure in a similar manner, the source gas is diluted preferably with Ar, $H_2$, He, or the like by a factor of 10 to 1000.

(Upper Transparent Electrode Layer 106, 506)

This layer is important for effectively introducing light to the semiconductor layer and for introducing the photoelectric current to the collecting electrodes without loss. For decreasing light absorption and improving reflection-preventing effect, the layer thickness should be controlled with sufficient reproducibility, and the resistivity should be minimized. The suitable material therefor includes $SnO_2$, $In_2O_3$, and ITO (indium-tin oxide). On this layer $MgF_2$, $TiO_2$, or the like may be stacked to increase the reflection-prevention effect. For example, ITO for the upper transparent electrode layer is formed preferably in a thickness ranging from 700 Å to 800 Å to effectively introduce the visible light into the semiconductor layer.

From the above material, the upper electrode is formed on the semiconductor layer usually by vacuum vapor deposition or sputtering, usually at a temperature ranging from 100° C. to 300° C. to obtain a transparent layer of low resistivity. Industrially, sputtering is preferred since it is capable of forming a layer having a larger area at a larger deposition rate. In view of the cost, reactive sputtering is suitable in which the layer is formed with a target of In, Sn, or InSn (Sn: 5 wt %) with introduction of Ar and $O_2$ into the deposition chamber.

(Collecting Electrode 107, 507)

The collecting electrode is preferably in a shape of a comb as viewed in the light incident direction as shown in FIG. 1B in order to decrease the loss of the photoelectric current and to efficiently introduce light into the semiconductor layer. Usually, the collecting electrode is made from a material having a high electroconductivity such as Au, Ag, Cu, and Al. The collecting electrode in the present invention may be constituted of a layer of a single metal, or combination of a layer of the above metal and another layer of another metal. However, when Au, Ag, or Cu which will cause migration is used, the migration should be prevented. Specifically, a wire of the above metal is coated with a carbon paste containing a urethane resin dissolved in cyclohexanone as a binder, and the coated wire is placed on the upper electrode and is dried, preferably. By the drying, cyclohexanone is evaporated from the wire, and the wire is fusion-bonded to the upper collecting electrode to result in sufficiently low contact resistance. Otherwise, a carbon paste is applied in the aforementioned electrode shape by screen printing, and the above metal is applied thereon by screen printing. The single Al layer, or plural layers of metals such as Cr/Al/Cr may be formed by vacuum vapor deposition with a mask covering the deposition surface, or sputtering. For improvement of chemical stability, Ti, Mn, Si, Mo, or the like is added in an amount ranging from about 0.1% to about 10%. On the area where the current density is high a busbar of copper plate may be simultaneously fusion-bonded as shown in FIG. 1B. When the substrate is electroconductive, a busbar may be fusion-bonded to the reverse surface of the substrate.

The present invention is specifically described by reference to a process for forming a zinc oxide film, and a solar cell employing the zinc oxide film. However, the present invention is not limited thereto.

EXAMPLE 1

An apparatus as shown in FIG. 2 was used in the experiment on formation of the zinc oxide layer of the present invention. An electroconductive substrate 201 as the negative electrode was a plate of stainless steel 430BA of 0.15 mm thick having Ag sputtered in a thickness of 300 nm and covered on the reverse surface with an insulating tape 206. The counter electrode 202 on the positive side was a 4-N zinc plate of 1 mm thick. The aqueous solution 203 was prepared by dissolving saccharose at a concentration of 10 g/liter as the carbohydrate in aqueous 0.23 mol/liter zinc nitrate solution, and was kept at 83° C. and pH 4.9. For the zinc oxide layer formation, the current was applied at a current density ranging from 1.0 mA/cm$^2$ (0.1 A/dm$^2$) to 3.0 mA/cm$^2$ (0.3 A/dm$^2$) with the potential difference of 1 V between the electroconductive substrate and the counter electrode. By application of the electric current for 10 minutes, zinc oxide layer of 1 μm thick was formed. On the obtained carbohydrate-containing zinc oxide layer (transparent electrode) of the present invention, a solar cell was prepared which has the structure shown in FIG. 5 having three p-i-n junctions as shown in FIG. 3. Specifically, on the obtained carbohydrate-containing zinc oxide layer of the present invention is formed first doped layer (n-type a-Si:H:P)/first i-type layer (a-SiGe:H)/second doped layer (p-type μc-Si:H:B)/third doped layer (n-type a-Si:H:P)/ second i-type layer (a-SiGe:H)/fourth doped layer (p-type μc-Si:H:B)/fifth doped layer (n-type a-Si:H:P)/third i-type layer (a-Si:H)/sixth doped layer (p-type μc-Si:H:B)/upper transparent electrode layer (ITO)/collecting electrode (Cu wire/Ag/C) by use of the materials shown respectively in the parentheses to produce a solar cell. The first i-type layer, and the second i-type layer were formed by the aforementioned microwave (MW) plasma CVD, and other layers were formed by RF plasma CVD under the conditions shown in Table 1. The upper transparent electrode was formed by sputtering. As shown in FIG. 1B, on one end side of the substrate on which the layers up to the upper transparent electrode layer had been formed, a commercial insulating double-coated tape, a Cu plate, the wiring (collecting electrodes) of constitution of Cu-wire/Ag/C and a busbar were placed and fusion-bonded by hot drying. Twelve solar cells were produced (Samples 1-1 to 1-12).

TABLE 1

| Semiconductor layer | Formation method | Film-forming temperature (° C.) | Layer thickness (pm) |
|---|---|---|---|
| First doped layer n-type, a-Si:H:P | RFCVD | 300 | 0.02 |
| First i-type layer a-SiGe:H | Microwave CVD | 275 | 0.1 |
| Second doped layer p-type, μc-SI:H:B | RFCVD | 250 | 0.01 |
| Third doped layer n-type, a-Si:H:P | RFCVD | 250 | 0.01 |
| Second i-type layer a-SiGe:H | Microwave CVD | 270 | 0.07 |
| Fourth doped layer p-type μc-Si:H:B | RFCVD | 245 | 0.01 |
| Fifth doped layer n-type, a-Si:H:P | RFCVD | 230 | 0.01 |
| Third i-type layer a-Si:H | RFCVD | 200 | 0.1 |
| Sixth doped layer p-type, μc-Si:H:B | RFCVD | 165 | 0.01 |

COMPARATIVE EXAMPLE 1

Twelve solar cells (Comparative Samples 1-1 to 1-12) were produced in the same manner as in Example 1 except that the carbohydrate was not added.

The zinc oxide thin layers formed in Example 1 and Comparative Example 1 were subjected to analysis of carbohydrate in the layers. The carbohydrate-containing zinc oxide layer was dissolved in aqueous 2% acetic acid solution, and the solution was analyzed by high-speed liquid chromatography. From the zinc oxide layers containing the carbohydrate of the present invention, the carbohydrate was detected in an amount corresponding to about 0.1 mg/cm$^3$ of saccharose. From the zinc oxide layers of Comparative Example 1, no carbohydrate was detected by the same analysis operation. The zinc oxide layers were tested for peeling. Specifically, when the zinc oxide film had been formed in Example 1 or Comparative Example 1, 36 scratches were made in a shape of a square of the sides of 5 mm long with a diamond cutter by applying a 100 g weight thereon. The scratched test samples were immersed in warm water at 60° C. for three days, and tested for peeling with polyimide tape.

As the result, the zinc oxide layer containing the carbohydrate of Example 1 of the present invention was peeled little, whereas the zinc oxide layer of Comparative Example 1 was peeled at two scratched sites. This shows that the zinc oxide layer containing the carbohydrate of Example 1 of the present invention is sufficiently bonded to the underlying substrate to further improve the durability of the photovoltaic device.

The solar cells of Example 1 (Samples 1-1 to 1-12) and Comparative Example 1 (Comparative Samples 1-1 to 1-12) were tested for initial characteristics (photoconductivity and short-circuit current). Specifically, the photoelectric conversion efficiency, and the short circuit photoelectric current were measured with a solar simulator (AM 1.5, 100 mW/cm$^2$, surface temperature 25° C.). As the result, the photovoltaic devices of Example 1 were superior to those of Comparative Example 1 in these characteristics by a factor of 1.1 and of 1.15, respectively. Then the samples were subjected to an HH-test (high-temperature high-humidity test) as an accelerated test. The two kinds of solar cells were placed in a environmental test box and kept at a temperature of 84° C. and a humidity of 85% for 250 hours. Then the temperature and the humidity of the environmental test box was set at 25° C. and 50% for one hour. The twelve solar cells were taken out and were tested in the same manner as described above for the photoelectric conversion efficiency, and the short circuit photoelectric current. As the result, the devices of Example 1 were superior to those of Comparative Example 1 in these characteristics by a factor of 1.09, and 1.13 in average, respectively. Subsequently, Samples 1-6 to 1-12 and Comparative Samples 1-6 to 1-12 were subjected to a light exposure test. After 950 hours of light exposure in the aforementioned solar simulator (AM 1.5, 100 mW/cm$^2$, surface temperature 50° C.), no defect was found in appearance of all the respective tested samples. The photoelectric conversion efficiency was decreased by the light exposure test. The ratio of the photoelectric conversion efficiency before and after the exposure test (after the test/before test) was 0.88 in average for Samples 1-6 to 1-12, and the same ratio for Comparative Samples 1-6 to 1-12 was 0.83 in average.

As shown above, the photovoltaic device of the present invention is superior to conventional ones.

EXAMPLE 2

In Example 2, an electroconductive substrate 201 as the negative side electrode was a plate of stainless steel 430BA of 0.15 mm thick having Al sputtered in a thickness of 80 nm and having sputtered zinc oxide thereon in a thickness of 100 nm as a transparent electroconductive intermediate layer. The reverse face of the electrode was covered with an insulating tape 206. The positive counter electrode 202 was a 4-N zinc plate of 1 mm thick. The aqueous solution 203 was prepared by dissolving saccharose at a concentration of 7 g/liter as the carbohydrate in aqueous 0.18 mol/liter zinc nitrate solution, and was kept at 85° C. and pH 4.8. For the zinc oxide layer formation, the current was applied at a current density ranging from 0.8 mA/cm$^2$ (0.08 A/dm$^2$) to 2.0 mA/cm$^2$ (0.2 A/dm$^2$) with the potential difference of 1.3 V between the electroconductive substrate and the counter electrode. On the obtained carbohydrate-containing zinc oxide layer of the present invention was produced a solar cell which has the structure shown in FIG. 1 having three p-i-n junctions in the same manner as in Example 1. Fifteen solar cells were produced (Samples 2-1 to 2-15).

COMPARATIVE EXAMPLE 2

Fifteen solar cells (Comparative Samples 2-1 to 1-15) were produced in the same manner as in Example 2 except that the carbohydrate was not contained in the aqueous solution.

The zinc oxide thin layers formed in Example 2 and Comparative Example 2 were subjected to analysis of carbohydrate content in the layers. The carbohydrate-containing zinc oxide layer was dissolved in aqueous 1% acetic acid solution, and the solution was analyzed by high-speed liquid chromatography. From the zinc oxide layers containing the carbohydrate of Example 2, the carbohydrate was detected in an amount corresponding to about 0.05 mg/cm$^3$ of saccharose. From the zinc oxide layers of Comparative Example 2, no carbohydrate was detected by the same analysis operation. The zinc oxide layers were tested for peeling. Specifically, when the zinc oxide film had been formed in Example 2 or Comparative Example 2, 49 scratches were made in a shape of a square of the sides of 5 mm long with a diamond cutter by applying a 150 g weight thereon. The scratched test samples were immersed in warm water at 65° C. for three days, and tested for peeling with Capton tape.

As the result, the zinc oxide layer containing the carbohydrate of Example 2 of the present invention was peeled little, whereas the zinc oxide layer of Comparative Example 2 was peeled at three scratched sites. This shows that the zinc oxide layer containing the carbohydrate of the present invention is sufficiently bonded to the underlying substrate to further improve the durability of the photovoltaic device.

The solar cells of Example 2 (Samples 2-1 to 2-15) and Comparative Example 2 (Comparative Samples 2-1 to 1-15) were tested for initial characteristics (photoconductivity and short-circuit current). Specifically, the photoelectric conversion efficiency and the short circuit photoelectric current were measured with a solar simulator (AM 1.5, 100 mW/cm$^2$, surface temperature 25° C.). As the result, the photovoltaic devices of Example 2 were superior to those of Comparative Example 2 in these characteristics by a factor of 1.13 and of 1.16, respectively. Then the samples were subjected to an HH-test (high-temperature high-humidity test) as an accelerated test. The two kinds of solar cells were placed in a environmental test box and kept at a temperature of 85° C. and a humidity of 85% for 350 hours. Then the temperature and the humidity of the environmental test box was set to 25° C. and 50% for one hour. The fifteen solar cells were taken out and were tested for the photoelectric conversion efficiency, and the short circuit photoelectric current. Consequently, the devices of Example 2 were superior to those of Comparative Example 2 by a factor of 1.08, and 1.12 in average, respectively. Subsequently, Samples 2-6 to 2-15 and Comparative Samples 2-6 to 2-15 were subjected to a light exposure test. After 1000 hours of light exposure in the aforementioned solar simulator (AM 1.5, 100 mW/cm$^2$, surface temperature 50° C.), no defect was found in appearance of the respective tested samples. The photoelectric conversion efficiency was decreased by the light exposure test. The ratio of the photoelectric conversion efficiency before and after the exposure (after the test/before test) was 0.87 in average for Samples 2-6 to 2-15, and the same ratio for Comparative Samples 2-6 to 2-15 was 0.83 in average.

As shown above, the photovoltaic device of the present invention is superior to conventional ones.

EXAMPLE 3

Figure 6A:
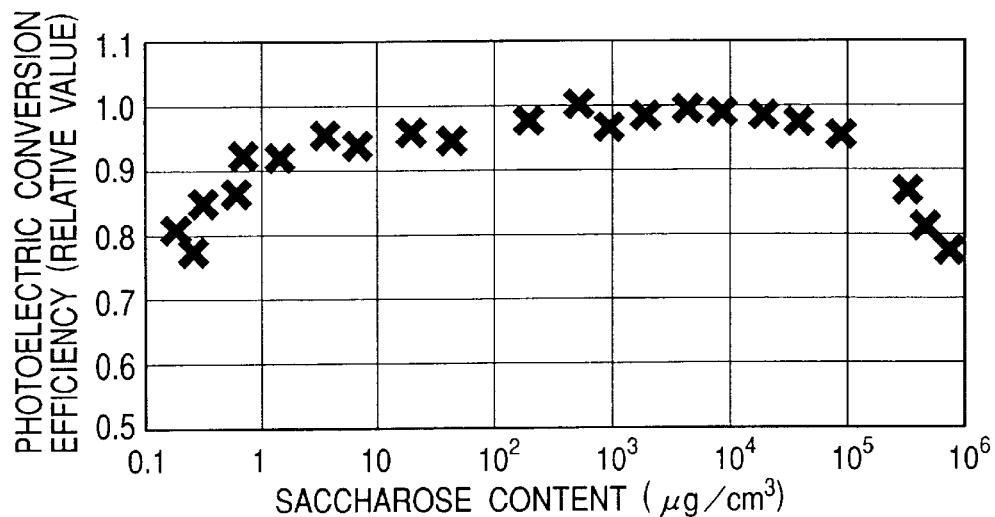
FIG. 6A is a graph showing the relationship of a saccharose content in a zinc oxide layer to a photoelectric conversion efficiency.
Figure 6B:
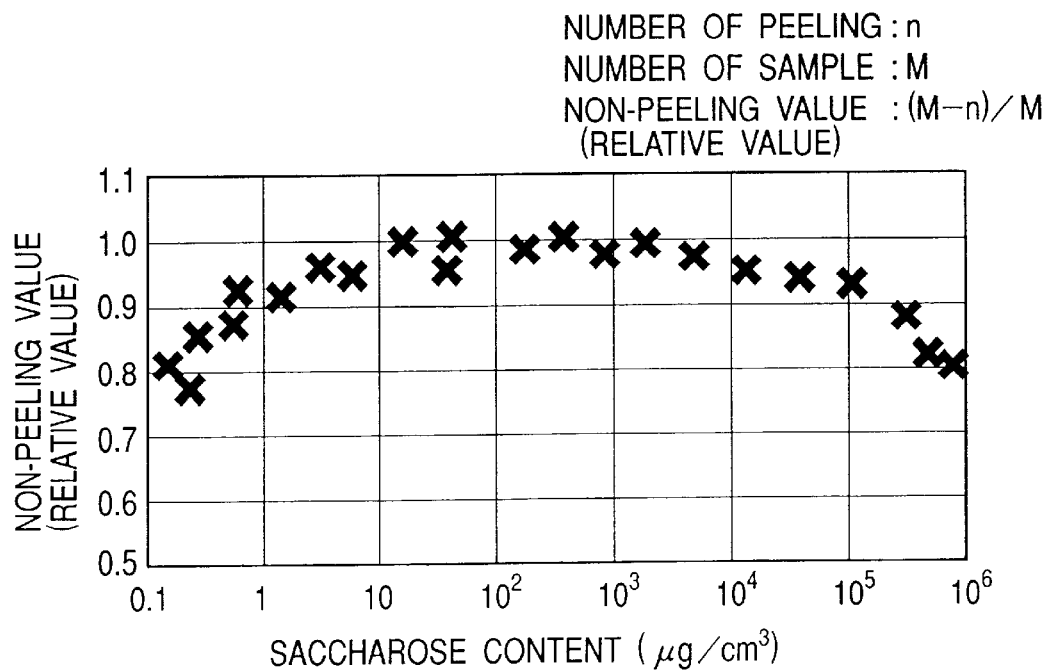
FIG. 6B is a graph showing the relationship of a saccharose content in the zinc oxide layer to a peeling state of the zinc oxide layer.

The saccharose concentration in the aqueous solution for zinc oxide layer formation was varied in experiment. Solar cells were produced in the same manner as in Example 1 except that the saccharose concentration in the aqueous solution for zinc oxide layer formation was varied to change the carbohydrate content in the zinc oxide layer in the range from 0 to 1000 mg/cm$^3$. As the result, the photoelectric conversion efficiency was highest at the saccharose content ranging from 1 $\mu$g/cm$^3$ to 100 mg/cm$^3$ as shown in FIG. 6A. The peeling test was conducted in the same manner as in Example 1. As the result, it was found that the peeling can be nearly prevented at the saccharose content ranging from 1 μg/cm³ to 100 mg/cm³ as shown in FIG. 6B. A cross-section of the peeled portion of the solar cell after this peeling test was observed by SEM. At the saccharose content lower than 1 μg/cm³, the peeling tended to occur between the underlying substrate and the zinc oxide layer, whereas at the saccharose content higher than 100 mg/cm³, the peeling tended to occur between the solar cell and the transparent electroconductive layer (zinc oxide layer). According to observation of the cross-section of the transparent electroconductive layer by SEM, many abnormally grown rising plate-like crystals were observed at the saccharose content lower than 1 μg/cm³, which seems to have caused a large leakage of the current to decrease the photoelectric conversion efficiency. On the other hand, at the saccharose content higher than 100 mg/cm³, the shape of the layer was extremely flat not to be sufficient for optical confinement and light diffusion, which seems to have lowered the photoelectric conversion efficiency.

EXAMPLE 4

Figure 8A:
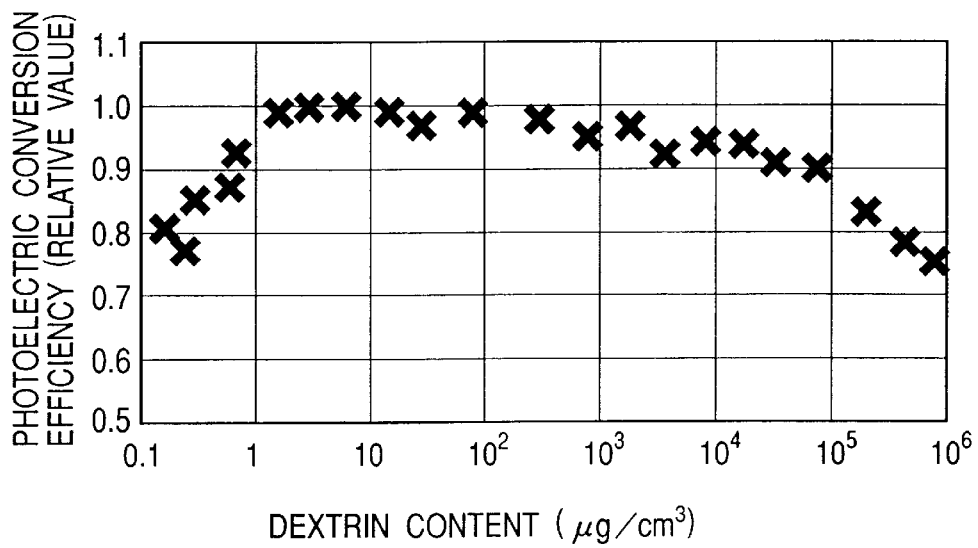
FIG. 8A is a graph showing the relationship of a dextrin content in a zinc oxide layer to a photoelectric conversion efficiency.
Figure 8B:
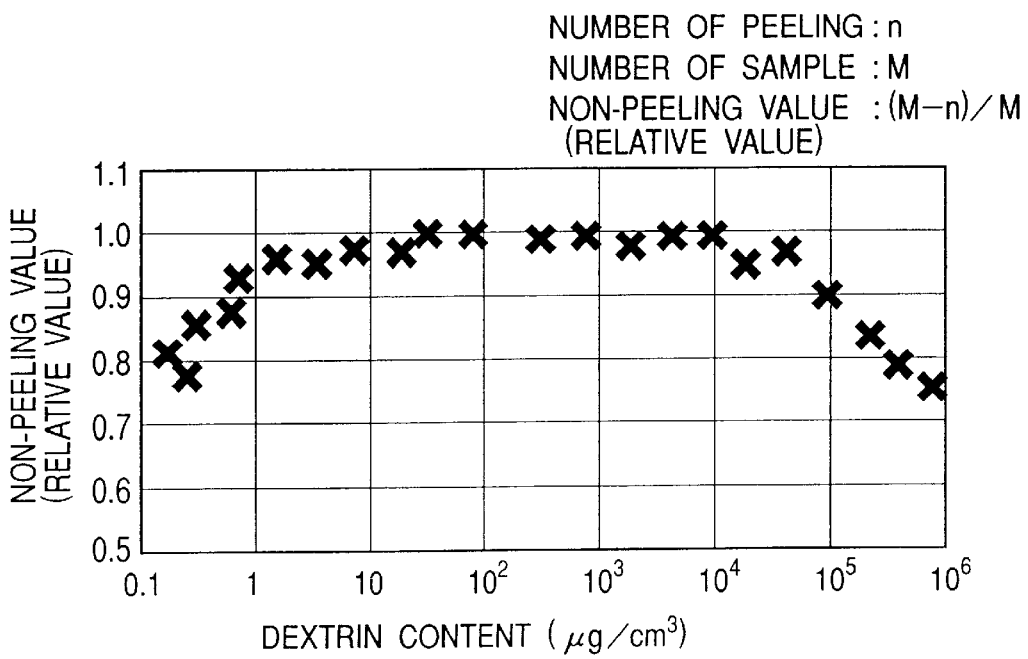
FIG. 8B is a graph showing the relationship of a dextrin content in the zinc oxide layer to a peeling state of a zinc oxide layer.

The dextrin concentration in the aqueous solution for zinc oxide layer formation was varied in experiment. Solar cells were produced in the same manner as in Example 1 except that dextrin was used in place of the saccharose and the concentration of the dextrin was varied to change the carbohydrate content in the zinc oxide layer in the range from 0 to 1000 mg/cm³. As the result, the photoelectric conversion efficiency was highest at the dextrin content ranging from 1 μg/cm³ to 100 mg/cm³ as shown in FIG. 8A. The peeling test was conducted in the same manner as in Example 1. As the result, it was found that the peeling can be nearly prevented at the dextrin content ranging from 1 μg/cm³ to 100 mg/cm³ as shown in FIG. 8B. A cross-section of the peeled portion of the solar cell after this peeling test was observed by SEM. At the dextrin content lower than 1 μg/cm³, the peeling tended to occur between the underlying substrate and the transparent electroconductive layer (zinc oxide layer), whereas at the dextrin content higher than 100 mg/cm³, the peeling tended to occur between the solar cell and the transparent electroconductive layer (zinc oxide layer). According to observation of the cross-section of the transparent electroconductive layer by SEM, many abnormally grown rising plate-like crystals were observed at the dextrin content lower than 1 μg/cm³, which seems to have caused a large leakage of the current to lower the photoelectric conversion efficiency. On the other hand, at the dextrin content higher than 100 mg/cm³, the shape of the layer was extremely flat not to be sufficient for optical confinement and light diffusion, which seems to have lowered the photoelectric conversion efficiency.

EXAMPLE 5

Figure 9A:
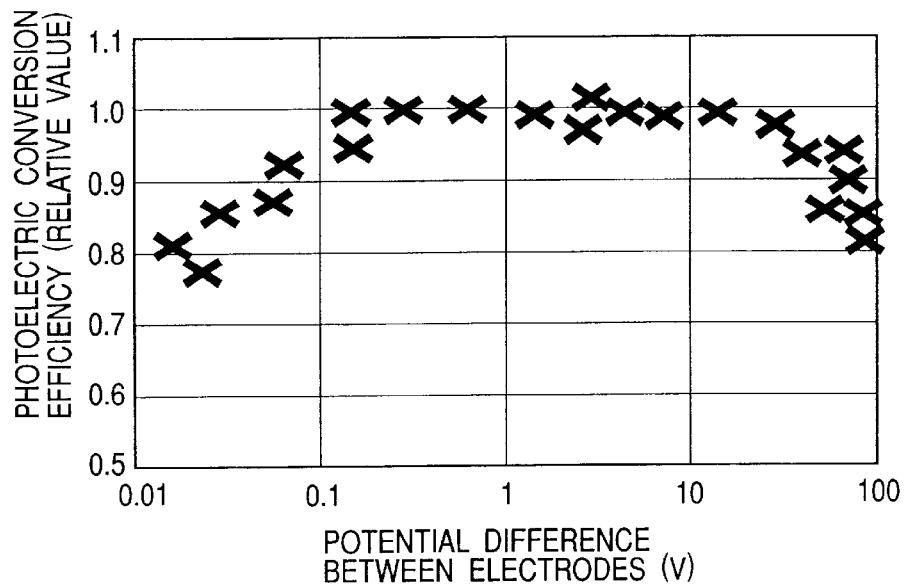
FIG. 9A is a graph showing the relationship of a potential difference between an electroconductive substrate and a counter electrode in zinc oxide layer formation to a photoelectric conversion efficiency.
Figure 9B:
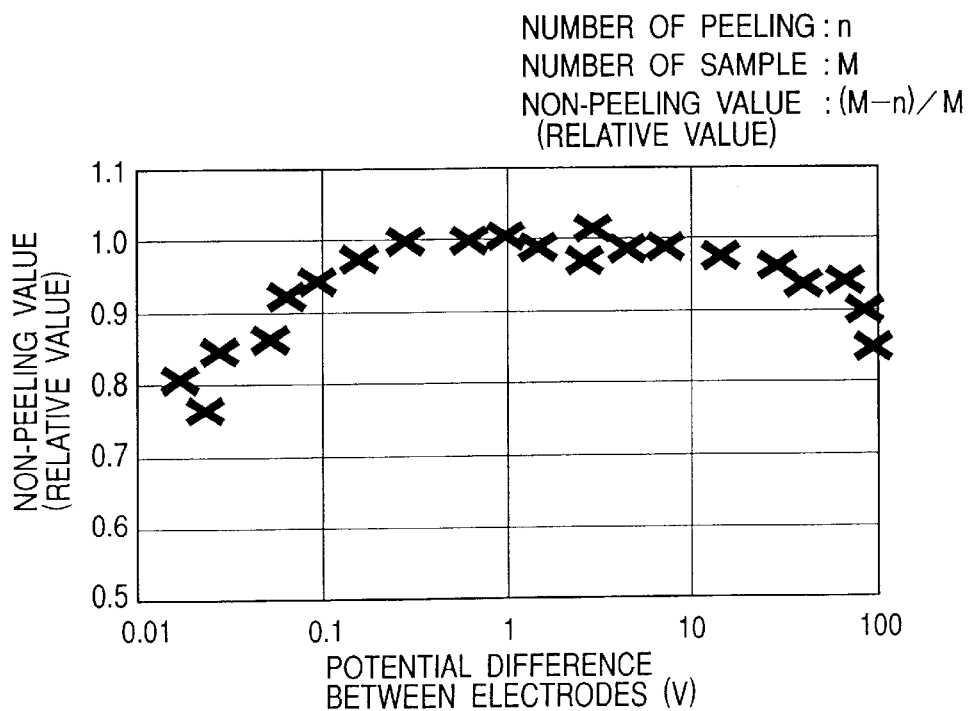
FIG. 9B is a graph showing the relationship of a potential difference between an electroconductive substrate and a counter electrode in zinc oxide layer formation to a peeling state of a zinc oxide layer.

The potential difference between the electroconductive substrate and the counter electrode was varied in zinc oxide layer formation experiment. Solar cells were produced in the same manner as in Example 1 except that the potential difference between the electroconductive substrate and the counter electrode was varied in the range from 0.01 V to 100 V. As the result, the photoelectric conversion efficiency was highest at the potential difference between the electroconductive substrate and the counter electrode in the range from 0.1 V to 30 V as shown in FIG. 9A. The peeling test was conducted in the same manner as in Example 1. As the result, it was found that the peeling can be nearly prevented at the potential difference between the electroconductive substrate and the counter electrode in the range of from 0.1 V to 30 V as shown in FIG. 9B. A cross-section of the peeled portion of the solar cell after this peeling test was observed by SEM. At the potential difference between the electroconductive substrate and the counter electrode of less than 0.1 V, the peeling tended to occur between the underlying substrate and the transparent electroconductive layer, whereas at the potential difference of more than 30 V, the peeling tended to occur between the solar cell and the transparent electroconductive layer. The cross-sections of the transparent electroconductive layers were observed by SEM. At the potential difference of less than 0.1 V, hexagonal columns strongly oriented to c-axis were regularly arranged in a flat shape not to be suitable for optical confinement and light diffusion, which seems to have decreased the photoelectric conversion efficiency. On the other hand, at the potential difference of more than 30 V, many abnormal grown large crystals were observed and the shape of the layer was extremely flat not to be suitable for optical confinement and light diffusion, which seems to have increased the current leakage to lower the photoelectric conversion efficiency.

EXAMPLE 6

A solar cell module as shown in FIGS. 4A and 4B was produced as another embodiment. The photovoltaic devices had the layer constitution as shown in FIGS. 1A and 1B. The semiconductor layer had three p-i-n junctions as in Example 1. A long sheet was used as the substrate. On the long sheet, all the layers were successively formed by a roll-to-roll system of high productivity. The process is described below in detail. Firstly, on a SUS 430BA sheet of 0.15 mm thick, an aluminum layer of 0.05 μm thick, and an intermediate layer of 0.1 μm thick composed of zinc oxide were formed by sputtering by a roll-to-roll system. Thereon, a carbohydrate-containing zinc oxide layer (transparent electroconductive layer) was electrochemically formed by means of the apparatus shown in FIG. 7.

Figure 7:
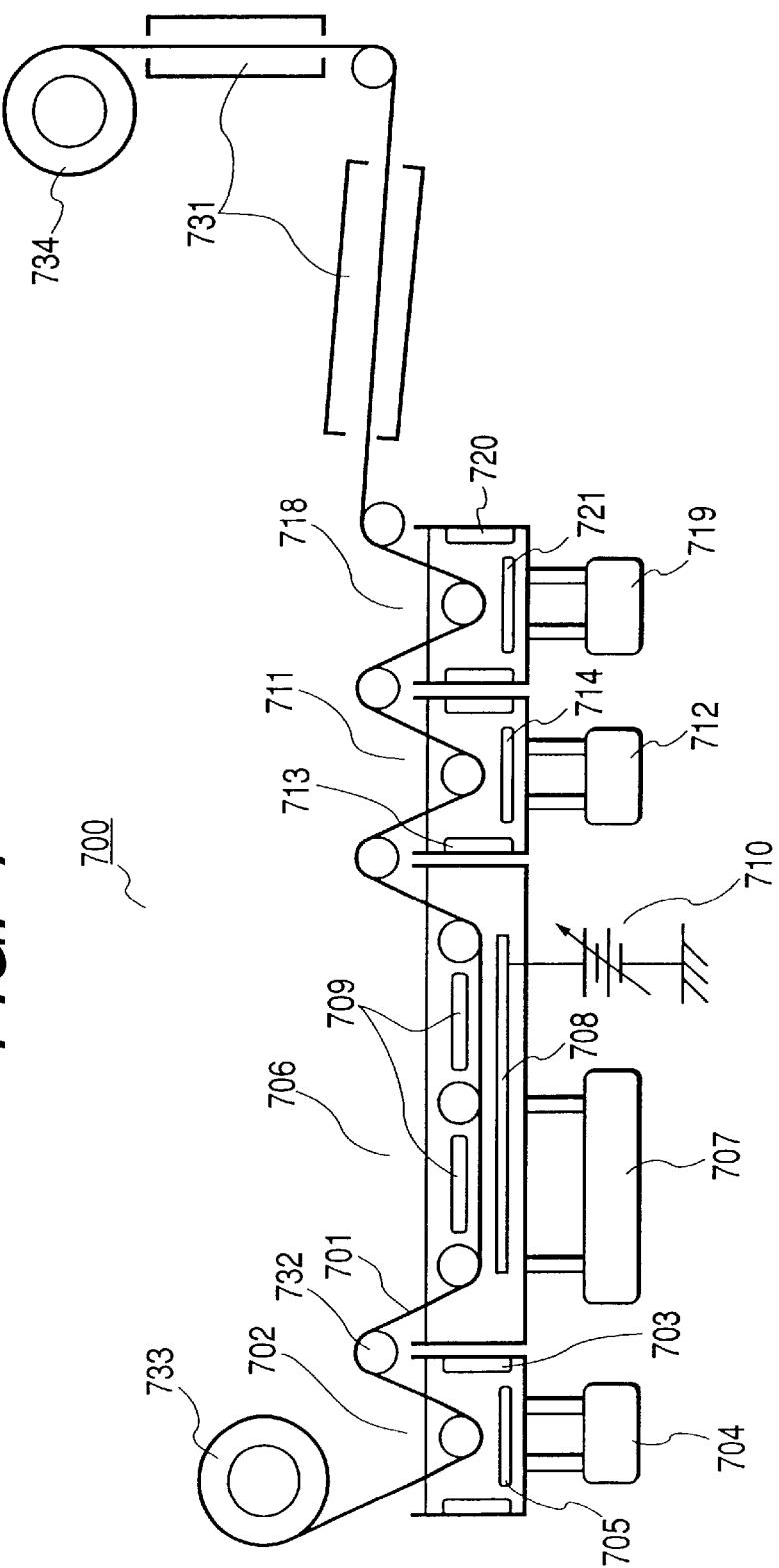
FIG. 7 illustrates schematically an apparatus for continuously forming a zinc oxide layer (thin film).

The apparatus 700 in FIG. 7 forms continuously a carbohydrate-containing zinc oxide layer of the present invention on the surface of a long sheet-shaped substrate 701 (ZnO/Al/SUS). As the substrate 701, a long flexible substrate like a stainless steel sheet can be used. An insulating tape not shown in the drawing is bonded on the reverse surface thereof. The substrate is wound by a feed roll 733, and is delivered by delivery rolls 732 through vessels to be wound up by a wind-up roll 734. The diameters of the respective rolls should be decided depending on the material quality of the electroconductive substrate 101 to prevent plastic deformation of the substrate. For example, for SUS 430BA of 0.15 mm thick, the diameter of the roller is not less than 40 cm. A first washing vessel 702 conducts supersonic organic solvent washing, and is connected to a circulation device 704 having a filter built therein for dust removal. The washing vessel is equipped therein with a supersonic vibration plate 703, and a heater 705. An electrodeposition vessel 706 forms zinc oxide layer. This vessel is also connected to a circulation device 707 having a filter built therein for dust removal. The electrodeposition vessel has a zinc electrode 708, and a heater 709. The electrode 708 is connected to a constant-current power source 710 on the outside of the vessel. The electrodeposition vessel is filled with an aqueous zinc nitrate solution containing saccharose at a concentration of 9 g/liter. The circulation device 707 monitors the concentration of the aqueous zinc nitrate solution, and replenishes suitably zinc nitrate. A second washing vessel 711 conducts supersonic pure water washing, and is connected to a circulation device 712 having a filter built therein for dust removal. The second washing vessel in equipped therein also with a supersonic vibration plate 713, and a heater 714. A third washing vessel 718 replaces the pure water by an alcohol or the like, and is connected to a circulation device 719 having a filter built therein for dust removal. The third washing vessel 718 is equipped therein also with a supersonic vibration plate 720, and a heater 721. The treated substrate is dried by hot air by passing through a drying chamber 731.

The operation of this apparatus is described below. The vessels are filled respectively with a predetermined solution, and the circulation devices, heaters, and the supersonic vibrators are driven. The temperature of the first washing layer is controlled by the heater to be equal to the temperature of the electrolytic vessel, the temperature of the second washing vessel is controlled to be at about 80° C. A substrate (Zn/Al/SUS) is fed from the feed roll and is delivered at predetermined speed through the first washing vessel, the electrodeposition vessel, the second washing vessel, the third washing vessel, and the drying chamber to the wind-up roll. Then, a predetermined density of electric current is applied from the constant current power source 710 to start continuous formation of the transparent electroconductive layer. When the substrate of 800 meter long has been treated for formation of the transparent electroconductive layer, the operation is stopped by stopping the delivery of the substrate, the electrodeposition power supply, the heating, and the supersonic vibration, and the substrates having the zinc oxide layer formed thereon is taken out.

A zinc oxide layer was formed in the above manner under the conditions shown in Table 2.

TABLE 2

| Step: | Formation of transparent electroconductive layer |
|---|---|
| Kind of aqueous solution: | Aqueous zinc nitrate solution |
| Concentration of aqueous solution (mol/liter): | 0.12 |
| Temperature of aqueous solution (° C.): | 82 |
| Current density (mA/cm$^2$): | 0.5 to 0.8 |
| Potential difference between electrodes (V): | 1.6 |
| Saccharase content (g/liter) **: | 9 |
| Layer thickness ($\mu$m): | 1.3 |

**Saccharose content in zinc oxide layer being 0.1 mg/cm$^3$

Subsequently, a semiconductor layer and a transparent electrode layer were formed on the formed transparent electroconductive layer by a roll-to-roll system as shown in Japanese Patent Application Laid-Open No. 06-181325. Specifically, first doped layer (n-type a-Si:H:P)/first i-type layer (a-SiGe:H)/second doped layer (p-type $\mu$c-Si:H:B)/third doped layer (n-type a-Si:H:P)/second i-type layer (a-SiGe:H)/fourth doped layer (p-type $\mu$c-Si:H:B)/fifth doped layer (n-type a-Si:H:P)/third i-type layer (a-Si:H)/sixth doped layer (p-type $\mu$c-Si:H:B)/upper transparent electrode layer (ITO) were formed under the conditions shown in Table 1.

From the obtained solar cell roll having been stacked with an ITO layer, solar cells were cut out in a size of 30×30 cm$^2$. Thereto, collecting electrodes and a busbar similar to the ones in Example 1 were fixed as shown in FIG. 1B. Four of the solar cells were connected in series, and by-pass diodes were connected in parallel to the solar cells as shown in FIG. 4B. Then, on a supporting base plate of 0.3 mm thick was stacked layers of EVA, nylon resin, EVA, glass nonwoven, the serially connected solar cells, glass nonwoven, EVA, glass nonwoven, EVA, glass nonwoven, and a fluororesin. The stacked layers were sealed by hot vacuum.

The solar cell module (Sample 6) of a size of 35×130 cm$^2$ produced above was subjected to measurements and tests in the same manner as in Example 1. As the results, the properties were found to be excellent by initial characteristics measurement, HH test, and light exposure test.

Further, the solar cell was subjected to twist test according to JIS C-8917. In this test, twist of 3 cm displacement was applied 100 times to one corner with the three corners fixed. The same test was conducted for all of the corners. The photoconductivity, current leakage, and low-illumination open-circuit voltage were measured and found to be 0.99, 1.09, and 0.96 relative to the value before the twist test.

A shown above, the photovoltaic module of the present invention was found to have excellent properties.

EXAMPLE 7

A carbohydrate-containing zinc oxide layer was formed with an apparatus as shown in FIG. 2. The electroconductive substrate 201 as the negative electrode was a stainless steel 430BA of 0.15 mm thick sputtered with Ag in a thickness of 300 nm, and was coated at the back surface with an insulating tape 206. The counter electrode 202 on the positive side is a 4-N zinc plate of 1 mm thick. The aqueous solution was a 0.04 mol/liter zinc hydroxide solution in aqueous 10% ammonia containing 8 g/liter of saccharose as the carbohydrate having pH of 10.4, and was kept at 68° C. A current in the range from 1.1 mA/cm$^2$ to 2.2 mA/cm$^2$ (0.11 A/dm$^2$ to 0.22 A/dm$^2$) was applied at the potential difference of 0.8 V between the electroconductive substrate and the counter electrode. On the obtained carbohydrate-containing zinc oxide layer, 15 solar cells were produced which each have three p-i-n junctions as shown in FIG. 1 under the same conditions as in Example 1 (Samples 7-1 to 7-15).

COMPARATIVE EXAMPLE 3

Fifteen solar cells (Comparative Samples 3-1 to 3-15) were produced in the same manner as in Example 7 except that the carbohydrate was not contained in the aqueous solution.

The zinc oxide layers formed in Example 7 and Comparative Example 3 were subjected to analysis of carbohydrate content in the layers. The carbohydrate-containing zinc oxide layer was dissolved in aqueous 1% acetic acid solution, and the solution was analyzed by high-speed liquid chromatography. From the zinc oxide layers containing the carbohydrate of Example 7, the carbohydrate was detected in an amount corresponding to about 0.04 mg/cm$^3$ of saccharose. From the zinc oxide layers of Comparative Example 3, no carbohydrate was detected by the same analysis operation. The zinc oxide layers were tested for peeling. Specifically, when the zinc oxide film had been formed in Example 7 or Comparative Example 3, 64 scratches were made in a shape of a square of the sides of 5 mm long with a diamond cutter by applying a 250 g weight thereon. The scratched test samples were immersed in warm water at 65° C. for 5 days, and tested for peeling with Capton tape.

As the result, the zinc oxide layer containing the carbohydrate of Example 7 of the present invention was peeled little, whereas the zinc oxide layer of Comparative Example 3 was peeled at 5 scratched sites. This shows that the zinc oxide layer containing the carbohydrate of the present invention is sufficiently bonded to the underlying substrate to further improve the durability of the photovoltaic device.

Further, the initial properties, (photoconductivity, and short-circuit current), accelerated test of the HH test (high-temperature high-humidity test), and the light irradiation test were conducted in the same manner as in Example 2 for comparison of the solar cells of Example 7 with the ones of Comparative Example 3.

As the results, the photovoltaic device of the present invention is found to be superior to conventional ones.

EXAMPLE 8

Fifteen solar cells (Samples 8-1 to 8-15) of constitution as shown in FIG. 1 were produced in the same manner as in Example 7 except that the aqueous solution was a 0.03 mol/liter zinc hydroxide solution in aqueous 12% ammonia containing 5 g/liter of saccharose as the carbohydrate and having pH of 10.5, and was kept at 65° C. A current of a density ranging from 1.4 $mA/cm^2$ to 2.6 $mA/cm^2$ (0.14 $A/dm^2$ to 0.26 $A/dm^2$) was applied at the potential difference of 2.5 V between the electroconductive substrate and the counter electrode.

COMPARATIVE EXAMPLE 4

Fifteen solar cells (Comparative Samples 4-1 to 4-15) were produced in the same manner as in Example 8 except that the carbohydrate was not contained in the aqueous solution.

The zinc oxide layers formed in Example 8 and Comparative Example 4 were subjected to analysis of carbohydrate content in the layers. The carbohydrate-containing zinc oxide layer was dissolved in aqueous 1% acetic acid solution, and the solution was analyzed by high-speed liquid chromatography. From the zinc oxide layers containing the carbohydrate of Example 8, the carbohydrate was detected in an amount corresponding to about 0.03 $mg/cm^3$ of saccharose. From the zinc oxide layer of Comparative Example 4, no carbohydrate was detected by the same analysis operation. The zinc oxide layers were tested for peeling. Specifically, on the zinc oxide film of Example 8 or Comparative Example 4, 64 scratches were made in a shape of a square of the sides of 5 mm long with a diamond cutter by applying a 200 g weight thereon. The scratched test samples were immersed in warm water at 65° C. for 5 days, and tested for peeling with Capton tape.

As the result, the zinc oxide layer containing the carbohydrate of Example 8 of the present invention was peeled little, whereas the zinc oxide layer of Comparative Example 4 was peeled at 4 scratched sites. This shows that the zinc oxide layer containing the carbohydrate of the present invention is sufficiently bonded to the underlying substrate to further improve the durability of the photovoltaic device.

Further, the initial properties, (photoconductivity, and short-circuit current), accelerated test of the HH test (high-temperature high-humidity test), and the light irradiation test were conducted in the same manner as in Example 2 for comparison of the solar cells of Example 8 with the ones of Comparative Example 4.

As the results, the photovoltaic device of the present invention is found to be superior to conventional ones.

The photovoltaic device employing the carbohydrate-containing zinc oxide layer of the present invention enables improvement of adhering to the underlaying substrate, improvement of heat stability, and control of shape of zinc oxide. As the results, it is possible to improve the photoconductive properties such as photoelectric conversion efficiency, short-circuit photoelectric current, and current leakage. Further, the photovoltaic device can be improved in durability in outdoor exposure test, HH test (high-temperature high-humidity environment test), and long-term light exposure. The zinc oxide layer can be electrochemically formed at a remarkably lower cost, thereby reducing the power cost of the solar cell.

What is claimed is:

1. A process for producing a photovoltaic device comprising a back reflection layer, comprising the steps of:

forming a first zinc oxide layer on the back reflection layer by sputtering; and forming a second zinc oxide layer on the first zinc oxide layer by electrodeposition, wherein the second zinc oxide layer contains a carbohydrate.

2. The process according to claim 1, wherein the carbohydrate is contained at a content ranging from 1 $\mu g/cm^3$ to 100 $mg/cm^3$.

3. The process according to claim 1, wherein the back reflection layer is composed of aluminum or a compound thereof.

4. The process according to claim 1, wherein a semiconductor layer is formed on the second zinc oxide layer.

5. The process according to claim 4, wherein the semiconductor layer comprises a non-single-crystalline semiconductor.

6. A process for producing a photovoltaic device having a back reflection layer, comprising the steps of:

forming a first zinc oxide layer on the back reflection layer by sputtering; and forming a second zinc oxide layer on the first zinc oxide layer by electrodeposition, wherein the second zinc oxide layer is formed by immersing an electroconductive substrate and a counter electrode into an aqueous solution containing at least zinc ions and a carbohydrate and applying a voltage between the counter electrode and the electroconductive substrate.

7. The process according to claim 6, wherein a potential difference between the electroconductive substrate and the counter electrode is 0.1 V to 30 V.

8. The process according to claim 6, wherein the aqueous solution contains at least zinc ions, carbohydrate and nitrate ions; the aqueous solution contains at least zinc ions, carbohydrate, ammonium ion and zinc-ammonia complex ions; or the aqueous solution contains zinc ions, carbohydrate, and hydrogenzincate ions or zincate ions.

* * * * *

UNITED STATES PATENT AND TRADEMARK OFFICE
CERTIFICATE OF CORRECTION

PATENT NO. : 6,613,603 B1
DATED : September 2, 2003
INVENTOR(S) : Masafumi Sano

It is certified that error appears in the above-identified patent and that said Letters Patent is hereby corrected as shown below:

Column 1,
Line 18, "is growing" should be deleted;
Line 19, "equipment" should read -- equipment has grown --;
Line 23, "soled" should read -- sold --;
Line 24, "brought" shoud read -- bought --; and
Line 28, "compete" should read -- compete with --.

Column 2,
Line 3, "of was" should read -- was --.

Column 3,
Line 27, "employs" should read -- employ --.

Column 5,
Line 21, "by reference to" should read -- in reference to the --.

Column 6,
Line 11, "suitable" should read -- suitably --; and
Line 12, "the both" should read -- both --.

Column 10,
Line 17, "material" should read -- materials --;
Line 18, "period" should read -- periods --;
Line 19, "which has" should read -- which have --; and
Line 33, "conducted" should read -- be conducted --.

Column 14,
Line 20, "to 1-15)" should read -- to 2-15) --; and
Line 31, "a environmental" should read -- an environmental --.

Column 16,
Line 17, "abnormal" should read -- abnormally --.

Column 17,
Line 1, "vessel in" should read -- vessel is" --;
Line 24, "800 meter" should read -- 800 meters --;
Table 2, "Saccharase" should read -- Saccharose --; and
Line 63, "thick was" should read -- thick were --.

UNITED STATES PATENT AND TRADEMARK OFFICE
CERTIFICATE OF CORRECTION

PATENT NO. : 6,613,603 B1
DATED : September 2, 2003
INVENTOR(S) : Masafumi Sano

It is certified that error appears in the above-identified patent and that said Letters Patent is hereby corrected as shown below:

Column 18,
Line 6, "to twist test" should read -- to a twist test --;
Line 13, "A shown" should read -- As shown --;
Line 31, "which each" should read -- with each --; and
Line 32, "have" should read -- having --.

Signed and Sealed this

Thirteenth Day of July, 2004

JON W. DUDAS
*Acting Director of the United States Patent and Trademark Office*